United States Patent
Leunissen et al.

(10) Patent No.: US 8,735,182 B2
(45) Date of Patent: May 27, 2014

(54) METHOD FOR DETECTING EMBEDDED VOIDS IN A SEMICONDUCTOR SUBSTRATE

(75) Inventors: Leonardus Leunissen, Hamme-Mille (BE); Sandip Halder, Heverlee (BE); Eric Beyne, Leuven (BE)

(73) Assignee: IMEC, Leuven (BE)

( * ) Notice: Subject to any disclaimer, the term of this patent is extended or adjusted under 35 U.S.C. 154(b) by 0 days.

(21) Appl. No.: 13/490,828

(22) Filed: Jun. 7, 2012

(65) Prior Publication Data

US 2012/0315712 A1 Dec. 13, 2012

(30) Foreign Application Priority Data

Jun. 7, 2011 (EP) ..................................... 11168942

(51) Int. Cl.
*H01L 21/66* (2006.01)
*H01L 21/00* (2006.01)

(52) U.S. Cl.
USPC ..................................... 438/14; 257/E21.53

(58) Field of Classification Search
USPC .................................................... 438/14–18
See application file for complete search history.

(56) References Cited

U.S. PATENT DOCUMENTS

| | | | |
|---|---|---|---|
| 5,914,183 A | 6/1999 | Canham | |
| 6,351,516 B1 | 2/2002 | Mazor et al. | |
| 7,301,619 B2 * | 11/2007 | Borden et al. | 356/237.1 |
| 7,403,001 B1 * | 7/2008 | Bailey, III | 324/239 |
| 7,776,741 B2 * | 8/2010 | Reid et al. | 438/678 |
| 8,058,186 B2 * | 11/2011 | Moriya et al. | 438/795 |
| 8,344,510 B2 * | 1/2013 | Enda | 257/751 |
| 2003/0061890 A1 | 4/2003 | Chen et al. | |
| 2003/0165178 A1 | 9/2003 | Borden et al. | |
| 2004/0040659 A1 | 3/2004 | Hasper | |
| 2005/0199078 A1 | 9/2005 | Temmler et al. | |
| 2005/0214956 A1 | 9/2005 | Li et al. | |
| 2010/0105169 A1 * | 4/2010 | Lee et al. | 438/107 |
| 2012/0264288 A1 * | 10/2012 | Furuya | 438/627 |
| 2012/0299194 A1 * | 11/2012 | Lee et al. | 257/774 |
| 2012/0305916 A1 * | 12/2012 | Liu et al. | 257/48 |
| 2013/0009305 A1 * | 1/2013 | Oshida | 257/737 |
| 2013/0037946 A1 * | 2/2013 | Kim et al. | 257/737 |

FOREIGN PATENT DOCUMENTS

KR 20030062123 A 7/2003

OTHER PUBLICATIONS

European Search Report, European Patent Application No. 11168942.8 dated Sep. 28, 2011.
Roth, Holger et al., "Inspection of Through Silicon Via (TSV) and Other Interconnection in IC Packages by Computed Tomography", Electronic System-Integration Technology Conference (ESTC), IEEE, Piscataway, NJ, USA, Sep. 13, 2010, pp. 1-4.

* cited by examiner

*Primary Examiner* — Scott B Geyer
*Assistant Examiner* — Evren Seven
(74) *Attorney, Agent, or Firm* — McDonnell Boehnen Hulbert & Berghoff LLP (57) ABSTRACT

A method for detecting embedded voids present in a structure formed in or on a semiconductor substrate is described. The method includes performing a processing step $P_1$ for forming the structure; measuring the mass $M_1$ of the substrate; performing thermal treatment; measuring the mass $M_2$ of the substrate; calculating the mass difference between the mass of the substrate measured before and after the performed thermal treatment; and deducing the presence of embedded voids in the structure by comparing the mass difference with a pre-determined value.

16 Claims, 4 Drawing Sheets

METHOD FOR DETECTING EMBEDDED VOIDS IN A SEMICONDUCTOR SUBSTRATE

CROSS REFERENCE TO RELATED APPLICATIONS

Pursuant to the provisions of 35 U.S.C. §119(b), this application claims priority to EP11168942.8 filed Jun. 7, 2012, the entire contents of which are incorporated herein by reference.

FIELD

The present invention relates to a method for detecting embedded voids present in a structure formed in or on a semiconductor substrate.

More in particular, the present invention relates to a method for detecting embedded voids present in a recess (or via and/or trench) filled with a material formed in a semiconductor substrate, such as a silicon wafer.

The method can for example be performed while manufacturing a three-dimensional integrated circuit (3D-IC, i.e., a chip in which two or more layers of active electrical components are integrated both vertically and horizontally in a single circuit), or during packaging of integrated circuits.

BACKGROUND

Integrated circuits (ICs) use metal lines to connect the various circuit elements together. These lines are called interconnect structures.

Because a high density of circuit elements and connections is required, it is necessary to use several levels of metal levels.

Each level contains a planar structure of metal lines, with layers of an insulator such as silicon dioxide used to separate the levels from one another.

It is necessary to interconnect the layers to one another, to enable current to flow between the layers. These interconnections are called vias.

Vias are located in small holes formed in the insulator. These holes are filled with a metal to form an interconnection between metal lines in different levels.

One type of via is for example a Through Silicon Via (TSV) etched through a silicon substrate (or wafer), to interconnect with another wafer. Those TSVs are useful in 3-dimensional stacking of integrated circuits (or chips), avoiding the use of external wiring bonding.

Unfortunately, variations in processing parameters, such as a deviation from a specified pressure, current, chemical composition or amount of additives of, e.g., the plating solution, and/or temperature while the via is being filled with metal, may lead to the formation of embedded voids (completely surrounded by the metal in the via) within the via.

Furthermore, embedded voids may similarly occur in other recessed regions (or recesses) such as trenches and contact structures in or on a substrate (or wafer) while these recesses are filled with a material.

Embedded voids are a site of potential future failure of the integrated circuit, compromising the performance of the device being manufactured.

Therefore, currently, a lot of attention is being given to the development of void free structures formed in or on a semiconductor substrate.

However, embedded voids are virtually impossible to detect by non-destructive defect inspection methods known in the art, such as optical or scanning electron microscope (SEM) surface inspection.

The known methods commonly available for finding and evaluating embedded voids, such as SEM or Transmission Electron Microscopy (TEM) in conjunction with cross-sectioning (i.e., cross sectional TEM or SEM) or with a focused ion beam, have the disadvantages of being destructive, requiring at least local destruction of the substrate (or wafer) under test, and are time-consuming and costly.

In performing for example a SEM sectioning method for detecting embedded voids in a wafer, a sample wafer is broken, or a focused ion beam is used to cut away material, exposing a side view of the via. The SEM can then image the via. This method has limitations of being destructive and slow (and is therefore limited to post-analysis of failures).

Cross sectional TEM is also a way of finding and evaluating embedded voids but having the disadvantage that it is a destructive method as well.

A non-destructive method like X-Ray Tomography (XRT) is also possible to be performed for finding and evaluating embedded voids, but this method has the disadvantage to only work for small samples, and not on the whole (or entire) substrate (or wafer).

Furthermore the measurement time with XRT can be hours, for example more than 12 hours for a single Through Silicon Via.

As such, these methods are not suitable for in-line monitoring of embedded voids present in a structure formed in or on a semiconductor substrate.

Therefore, the detection of the presence (or absence) of embedded voids in structures formed in or on a semiconductor substrate remains a challenging problem.

SUMMARY

The present invention aims to provide an improved and alternative method for detecting embedded voids present in a structure formed in or on a semiconductor substrate which does not present the drawbacks of prior art techniques.

In particular, the present invention aims to provide a fast, in-line, low-cost method for detecting embedded voids present in the structure.

Another aim of the present invention is to propose a non-destructive method for detecting embedded voids present in the structure.

The present invention provides a method particularly advantageous for detecting embedded voids present in a structure formed in or on a semiconductor substrate, which does not present the drawbacks of prior art techniques.

The method of the present invention has the advantage over existing methods in prior art that it is a fast, in-line, low-cost method.

The method of the present invention provides the advantage of being a non-destructive method, when compared to processes known in the art.

Furthermore, the method of the present invention provides the advantage of being independent of processing steps adding or removing a non-predictable amount of material on or from the substrate, such as a chemical-mechanical processing (or chemical-mechanical polishing, or CMP) step.

The method of the present invention has the advantage over existing methods in prior art that it can be performed on the device substrate (not on a test substrate). The result of the method gives a measure of the voids present over the whole (or entire) (semiconductor) substrate (or wafer).

The method of the present invention provides the advantage that it can be performed at different stages in the process flow for forming a structure in or on the (semiconductor) substrate (or wafer).

The present invention provides a method for detecting embedded voids present in a structure formed in or on a semiconductor substrate, the method comprising:

performing at least one (first) processing step $P_1$ for forming the structure;
measuring the mass $M_1$ of the substrate;
performing a thermal treatment (or heating step);
measuring the mass $M_2$ of the substrate;
calculating the mass difference between the mass of the substrate measured before and after the performed thermal treatment (or between the measured mass $M_1$ of the substrate and the measured mass $M_2$ of the substrate); and
deducing the presence of embedded voids in the structure by comparing the mass difference with a pre-determined value.

In the context of the present invention, "an embedded void" is a void in a structure (formed in or on a semiconductor substrate) that is completely surrounded by the material of the structure.

In the context of the present invention, the mass of the substrate measured (by performing a first step of measuring the mass of the substrate) before performing the thermal treatment is denoted as $M_1$ (or first measured mass).

In the context of the present invention, the mass of the substrate measured (by performing a second step of measuring the mass of the substrate) after performing the thermal treatment is denoted as $M_2$ (or second measured mass).

In the context of the present invention, the "mass difference between the mass of the substrate measured before and after the performed thermal treatment" refers to the absolute value (or modulus) of the mass of the substrate $M_1$ measured before the performed thermal treatment subtracted with the mass of the substrate $M_2$ measured after the performed thermal treatment (the absolute value (or modulus) of the difference between $M_1$ and $M_2$ being denoted as $|M_1-M_2|$).

In a method of the invention, the at least one processing step $P_1$ for forming the structure can be a step of filling the (recessed) structure (or via, or trench) with a material (in specific embodiments with a conductive material). Forming the structure further comprises prior to the step of filling the structure, a step of patterning the structure and depositing conformally a thin layer of barrier and/or (Cu-)seed material on the patterned structure.

In a preferred method of the invention, the step of measuring the mass $M_1$ of the substrate is performed immediately (i.e., with no intermediate step) before (or immediately prior to) performing the step of thermal treatment (or heating step), and/or the step of measuring the mass $M_2$ of the substrate is performed immediately (i.e., with no intermediate step) after (or immediately follows) performing the step of thermal treatment (or heating step).

In the context of the present invention, by the expressions "immediately before" and "immediately after", it is meant to reflect that no other additional processing steps are performed in between the two corresponding processing steps.

More preferably, the step of measuring the mass $M_1$ of the substrate is performed immediately (i.e., with no intermediate step) before (or immediately prior to) performing the step of thermal treatment (or heating step), and the step of measuring the mass $M_2$ of the substrate is performed immediately (i.e., with no intermediate step) after (or immediately follows) performing the step of thermal treatment (or heating step).

More particularly, no intermediate step is performed between performing the step of measuring the mass $M_1$ of the substrate and performing the step of thermal treatment (or heating step).

More particularly, no intermediate step is performed between performing the step of thermal treatment (or heating step) and performing the step of measuring the mass $M_2$ of the substrate.

Alternatively, a method of the invention further comprises at least one (second) processing step $P_2$ for forming the structure between the step of measuring the mass $M_1$ of the substrate and the step of performing a thermal treatment, and/or between the step of performing a thermal treatment and the step of measuring the mass $M_2$ of the substrate, provided the at least one processing step $P_2$ is not a step of adding or removing (an amount of) material on or from the substrate.

More particularly, the at least one processing step $P_2$ for forming the structure can be a step of wafer handling (e.g., sorting the wafer), or a step of non-destructive and/or in-line metrology (e.g., measuring a sheet resistance).

In a particular embodiment of the invention, the step of performing the at least one processing step $P_1$ for forming the structure is performed after the step of measuring the mass $M_1$ of the substrate and before the step of performing the thermal treatment, provided the at least one processing step $P_1$ is not a step of adding or removing a non-predictable amount of material on or from the substrate.

Processing steps adding or removing a non-predictable amount of material on or from the substrate will be apparent to those skilled in the art.

More particularly, the (excluded) at least one processing step $P_1$ removing a non-predictable amount of material from the substrate is a chemical-mechanical processing (or chemical-mechanical polishing, or CMP) step, or a step of wet etching or cleaning, grinding, or dicing.

More particularly, the (excluded) at least one processing step $P_1$ adding a non-predictable amount of material on the substrate is any deposition step wherein the deposition rate, depending on the process conditions (such as amount of precursors supplied, temperature, pressure), and/or the deposition time are not known or not controllable.

More particularly, in a method of the invention, the step of performing the at least one (first) processing step $P_1$ for forming the structure is performed after the step of measuring the mass $M_1$ of the substrate and before the step of performing the thermal treatment, and the at least one processing step $P_1$ is adding or removing a predictable amount of material on or from the substrate.

Suitable processing steps adding or removing a predictable amount of material on or from the substrate for use in the method of the invention will be apparent to those skilled in the art.

In the context of the present invention, in a processing step adding or removing a predictable amount of material on or from the substrate, the predictable amount of material can be estimated (or calculated) by knowing the deposition or removal rate, depending on the process conditions (such as amount of precursors supplied, temperature, pressure), and the duration of the processing step.

More preferably, in a method of the invention, the processing step adding a predictable amount of material on the substrate is known in the art, even more preferably the processing step is a plating step, or a physical vapor deposition (PVD) step, or a CVD deposition step.

More preferably, in a method of the invention, the processing step removing a predictable amount of material from the substrate is known in the art, even more preferably the processing step is a step of timed dry-etching under known process conditions (or known etch rate), or selective dry-etching.

In another embodiment of the invention, the step of measuring the mass $M_1$ of the substrate is performed immediately (i.e., with no intermediate step) before (or immediately prior to) performing the at least one processing step $P_1$, and/or the step of thermal treatment is performed immediately (i.e., with no intermediate step) after (or immediately follows) performing the at least one processing step $P_1$, and/or the step of measuring the mass $M_2$ of the substrate is performed immediately (i.e., with no intermediate step) after (or immediately follows) performing the step of thermal treatment.

More particularly, the step of measuring the mass $M_1$ of the substrate is performed immediately (i.e., with no intermediate step) before (or immediately prior to) performing the at least one processing step $P_1$, and the step of thermal treatment is performed immediately (i.e., with no intermediate step) after (or immediately follows) performing the at least one processing step $P_1$, and the step of measuring the mass $M_2$ of the substrate is performed immediately (i.e., with no intermediate step) after (or immediately follows) performing the step of thermal treatment.

More particularly, no intermediate step is performed between performing the step of measuring the mass $M_1$ of the substrate and performing the at least one processing step $P_1$.

More particularly, no intermediate step is performed between performing the at least one processing step $P_1$ and performing the step of thermal treatment (or heating step).

More particularly, no intermediate step is performed between performing the step of thermal treatment (or heating step) and performing the step of measuring the mass $M_2$.

Alternatively, a method of the invention further comprises at least one processing step $P_2$ for forming the structure before the step of measuring the mass $M_1$ of the substrate.

More particularly, the at least one processing step $P_2$ for forming the structure can be a step of patterning the structure and depositing conformally a thin layer of barrier and/or (Cu-)seed material on the patterned structure (prior to a step of filling the (recessed) structure), a step of wafer handling, or a step of (non-destructive) in-line metrology.

A method of the invention can further comprise at least one processing step $P_2$ for forming the structure between the step of measuring the mass $M_1$ of the substrate and the at least one processing step $P_1$, and/or between the at least one processing step $P_1$ and the step of performing a thermal treatment, and/or between the step of performing a thermal treatment and the step of measuring the mass $M_2$ of the substrate, provided the at least one processing step $P_2$ is not a step of adding or removing (an amount of) material on or from the substrate.

More particularly, the at least one processing step $P_2$ for forming the structure can be a step of wafer handling, or a step of non-destructive and/or in-line metrology.

Preferably, in a method according to the invention, the structure comprises at least one recess (or recessed region, or recessed structure) formed in the substrate, and the at least one processing step $P_1$ is a step of filling the at least one recess with (an amount of) material (or a step of depositing or adding (an amount of) material in the at least one recess).

In alternative embodiments, the material is a material which is deposited by MOCVD, such as a dielectric material, or more particularly a high-k dielectric material (having a dielectric constant higher than the dielectric constant of silicon oxide).

More preferably, in a method of the invention, the structure comprises multiple recesses (or recessed regions).

More preferably, in a method according to the invention, the at least one recess (or recessed region) is formed in the substrate by a patterning process (i.e., lithography and etching process).

More preferably, the at least one recess is a via and/or a trench.

More particularly, the at least one recess is a via and trench, as for example in damascene processes.

More preferably, the at least one recess has an (high) aspect ratio (or width to height ratio) comprised between 1:1 and 1:100.

In the context of the present invention, a "high aspect ratio" of a recess (or via, or trench) refers to (the value of) the height of the recess (or via, or trench) being as high as or higher than (the value of) its width.

More preferably, the filling of the at least one recess with (an amount of) material is performed by electroplating, electroless plating, Metal-organic Chemical Vapor Deposition (MOCVD), Chemical Vapor Deposition (CVD), or Physical Vapor Deposition (PVD).

More preferably, the at least one recess is filled with (an amount of) conductive material by electroplating or electroless plating (so as to form, or for forming, a (plurality of) conductive structure(s)).

More particularly, the structure comprises (or consists of) a (plurality of) conductive structure(s).

More preferably, in a method of the invention, the thermal treatment (or heating step) is performed for driving out and evaporating plating liquid (e.g., a sulphuric acid-comprising liquid) from voids present in the structure formed in or on the semiconductor substrate during the plating step.

In a method of the invention, the thermal treatment (or heating step) can be performed by (non-selectively) heating the whole (or entire) substrate, or by locally (or selectively) heating or annealing the substrate (for example, by scanning the substrate when performing a laser anneal).

More particularly, the thermal treatment (or heating step) is a thermal anneal, or a laser anneal.

More preferably, the step of performing a thermal treatment (or heating step) is performed for annealing the conductive material (for forming the (plurality of) conductive structure(s)).

More particularly, the thermal treatment (or heating step) is performed for adjusting the grain size of the conductive material.

Even more preferably, the (amount of) conductive material is copper (Cu) or tungsten (W).

Advantageously, the conductive material is copper (Cu).

More preferably, the temperature and the time of the thermal treatment (or heating step) increases with increasing aspect ratio of the at least one recess.

More particularly, the temperature and the time of the thermal treatment (or heating step) is sufficient for evaporating the plating liquid from voids present in the structure formed in or on the semiconductor substrate during the plating step.

Preferably, in a method of the invention, the thermal treatment is performed at a temperature range between (about) 120° C. and (about) 430° C.

Preferably, in a method of the invention, the thermal treatment is performed for at least (about) 20 minutes at (about) 430° C.

In the context of the present invention, a "semiconductor substrate" refers to a semiconductor substrate per se, or to a semiconductor layer formed on a (semiconductor) substrate.

Preferably, in a method of the invention, the (semiconductor) substrate (or the semiconductor layer formed on the (semiconductor) substrate) is selected from the group consisting of silicon, silicon carbide, germanium, glass, quartz, a group III-V semiconductor material, or any combinations or mixtures thereof.

More preferably, the substrate is silicon (or a silicon wafer).

More preferably, in a method of the invention, the at least one recess is a Through Silicon Via (TSV).

Preferably, a method of the invention is performed while manufacturing a three-dimensional integrated circuit, or during packaging.

More particularly, a method of the present invention is performed for non-destructive detection of embedded voids in a structure formed in or on a (semiconductor) substrate (or wafer), avoiding/preventing further processing of the substrate.

More particularly, a method of the present invention is performed for preventing a defective integrated circuit (or chip) from being formed on a (semiconductor) substrate (or wafer) comprising structures with embedded voids.

In the method of the invention, the presence of embedded voids in the structure is deduced by comparing the mass difference calculated between the mass of the substrate measured before and after the performed thermal treatment (or heating step) with a pre-determined (threshold) value.

In the context of the present invention, the pre-determined (threshold) value refers to a (threshold) weight value corresponding to the maximum acceptable weight loss (equivalent mass corresponding to the total volume of the embedded voids, or threshold weight loss) due to the embedded voids (in a via and/or a trench in the substrate).

The total volume of the embedded voids can be calculated knowing the weight loss and the density of the filling material (e.g., Cu).

Assuming the embedded voids have all a particular diameter (e.g., the diameter of the TSV) and a particular height, the threshold weight loss can be converted in a maximum (acceptable) number of embedded voids of the particular diameter and the particular height. In other words, the pre-determined (threshold) value corresponds to a maximum (acceptable) number of embedded voids. The maximum (acceptable) number of embedded voids allowed varies according to the application and the technology node involved.

In the method of the present invention, the pre-determined (threshold) weight loss value (corresponding to a maximum acceptable number of embedded voids) present in a structure formed in or on a (semiconductor) substrate will be apparent to those skilled in the art.

In the context of the present invention, an acceptable number (or value) of embedded voids (present in a structure formed in or on a (semiconductor) substrate refers to a value being lower than or equal to the maximum (acceptable) number (or value) of embedded voids.

An acceptable number of embedded voids triggers the decision to resume the processing steps for forming (or finalizing) the structure without (or minimizing the risk of) compromising the electrical performance of the device (or integrated circuit, or chip) being manufactured (from the structure).

In the context of the present invention, the minimum threshold weight loss value is higher than the measured noise level of the metrology.

In the context of the present invention, an acceptable (or suitable) (semiconductor) substrate refers to a (semiconductor) substrate having an acceptable number of embedded voids present in a structure formed in or on the (semiconductor) substrate.

An acceptable (or suitable) (semiconductor) substrate corresponds to a substrate having a weight loss originating in the structures comprising voids below an accepted threshold. The accepted threshold is defined on the wafer level, depending on the device type manufactured on the wafer and the number of devices on the wafer. The specifications for different devices might vary in function of application, materials or technology node.

Preferably, in a method of the invention, after performing the step of comparing the mass difference with a pre-determined (threshold) value, the step deducing that an acceptable number of embedded voids is present in the structure formed in or on the (semiconductor) substrate, at least one (third) processing step $P_3$ (for forming the structure) is performed.

More preferably, the at least one processing step $P_3$ is a chemical-mechanical processing (or chemical-mechanical polishing, or CMP) step. Further steps, as for example dielectric deposition, are possible, but the steps are not part of 'steps for forming the structure'.

DESCRIPTION OF THE DRAWINGS

FIG. 4 depicts the minimum number of TSV's required for voids to be detected versus the height of the voids. From FIG. 4 it can be derived that an equivalent number of voids having a certain height (as depicted on the x-axis) can be detected for a weight balance sensitivity of 100 micrograms. The estimation is made for TSV's having a width to height ratio of 5×50 microns, assuming that the void diameter equals the TSV diameter, and assuming that the void is empty.

DETAILED DESCRIPTION

An improved and alternative method for detecting embedded voids present in a structure formed in or on a semiconductor substrate that does not present the drawbacks of prior art techniques is described.

It is desirable to provide a fast, in-line, low-cost method for detecting embedded voids present in the structure.

It is also desirable to provide a non-destructive method for detecting embedded voids present in the structure.

Furthermore, it is desirable to provide a method for detecting embedded voids, the method being independent of processing steps adding or removing a non-predictable amount of material on or from the substrate, such as a chemical-mechanical processing (or chemical-mechanical polishing, or CMP) step.

Furthermore, the method can be performed on the same (or whole, or entire) (semiconductor) substrate (or wafer).

The method also provides the advantage that it can be performed anywhere in the process flow for forming a structure in or on the (semiconductor) substrate (or wafer).

According to the present invention, it is provided a method for detecting embedded voids present in a structure formed in or on a semiconductor substrate, wherein the method comprises (or consists of) the steps of:

performing at least one processing step $P_1$ for forming the structure;

measuring the mass $M_1$ of the substrate;

performing a thermal treatment;

measuring the mass $M_2$ of the substrate;

calculating the mass difference between the mass of the substrate measured before and after the performed thermal treatment (or between the measured mass $M_1$ of the substrate and the measured mass $M_2$ of the substrate); and deducing the presence of embedded voids in the structure by comparing the mass difference with a pre-determined value.

The method comprises a first step of performing at least one processing step $P_1$ for forming a structure in or on a semiconductor substrate.

In the context of the method, any processing step $P_1$ for forming the structure can be performed. Suitable processing step $P_1$ for use herein may be easily identified by those skilled in the art.

In a preferred method, suitable processing steps $P_1$ for forming the structure are a step of filling the (recessed) structure (or via, or trench) with a material (in specific embodiments with a conductive material). $P_1$ may further comprise a step of patterning the structure and depositing conformally a thin layer of barrier and/or (Cu-)seed material on the patterned structure (prior to the step of filling the structure).

In a preferred method, the structure comprises (or consists of) at least one recess (previously) formed in the substrate, and the at least one processing step $P_1$ is a step of filling the at least one recess with material (or a step of depositing material in the at least one recess).

In alternative embodiments, the material is a high-k (dielectric) material which is deposited by deposit, or an oxide, etc.

In a preferred method, the structure comprises multiple recesses.

In a preferred method, the at least one recess is (previously) formed in the structure by a patterning process.

More preferably, the at least one recess is a via and/or a trench.

Even more preferably, the at least one recess is a Through Silicon Via (TSV).

More preferably, the at least one recess has an (high) aspect ratio comprised between 1:1 and 1:100.

In a preferred method, the filling of the at least one recess with material is performed by electroplating, electroless plating, Metal-organic Chemical Vapor Deposition (MOCVD), Chemical Vapor Deposition (CVD), or Physical Vapor Deposition (PVD).

More preferably, the at least one recess is filled with conductive material by electroplating or electroless plating. When performing the step of filling the at least one recess with conductive material a (plurality of) conductive structure(s) is formed.

In the context of the method, any conductive material can be used for filling the at least one recess. Suitable conductive material for use herein may be easily identified by those skilled in the art.

In a preferred method, suitable conductive material is copper (Cu) or tungsten (W).

More preferably, the conductive material is copper (Cu).

In the context of the method, any substrate compatible with semiconductor manufacturing may be used. Suitable substrates for use herein may be easily identified by those skilled in the art.

In a preferred method, suitable substrates are silicon, silicon carbide, germanium, glass, quartz, a group III-V semiconductor material, or any combinations or mixtures thereof.

More preferably, a substrate for use herein is silicon.

Accordingly, in a preferred method, the substrate is a silicon wafer.

The method comprises a second step of measuring the mass $M_1$ of the substrate (before performing the thermal treatment).

In the method, measuring the mass of the substrate is performed using any technique (or using any mass metrology tool or weight balance) suitable to be used in semiconductor manufacturing.

The method further comprises a third step of performing a thermal treatment.

In a preferred method, the thermal treatment is a thermal anneal, or a laser anneal.

Preferably, the thermal treatment (is performed by (non-)selectively) heating the whole substrate.

Alternatively, the thermal treatment is locally (or selectively) applied by heating or annealing part of the substrate. Where laser anneal is performed, the laser scans the substrate.

In a preferred method, the step of performing the thermal treatment is performed for filling the at least one recess with conductive material. When performing the step of thermal treatment for filling the at least one recess with conductive material, a (plurality of) conductive structure(s) is formed.

More preferably, the thermal treatment is performed for adjusting the grain size of the conductive material.

More preferably, the thermal treatment is performed for driving out and evaporating plating liquid from voids present in the structure formed in or on the semiconductor substrate during the plating step.

In a preferred method, the temperature and the time of the thermal treatment (or heating step) increases with increasing aspect ratio of the at least one recess.

Preferably, in the method, the thermal treatment is performed at a temperature range between 120° C. up to 430° C.

Preferably, in the method, the thermal treatment is performed for at least 20 minutes at 430° C.

The method involves the next (or fourth) step of measuring the mass $M_2$ of the substrate (after having performed the thermal treatment).

In a preferred method, the step of measuring the mass $M_1$ of the substrate is performed immediately before performing the step of thermal treatment, and/or the step of measuring the mass $M_2$ of the substrate is performed immediately after performing the step of thermal treatment.

Alternatively, a preferred method further comprises at least one processing step $P_2$ for forming the structure between the step of measuring the mass $M_1$ of the substrate and the step of performing a thermal treatment, and/or between the step of performing a thermal treatment and the step of measuring the mass $M_2$ of the substrate, provided the at least one processing step $P_2$ is not a step of adding or removing material on or from the substrate.

In the preferred method, suitable processing steps $P_2$ for forming the structure are a step of wafer handling (e.g., sorting the wafer), or a step of non-destructive and/or in-line metrology (e.g., measuring a sheet resistance).

In another preferred method, the step of performing the at least one processing step $P_1$ for forming the structure is performed after the step of measuring the mass $M_1$ of the substrate and before the step of performing the thermal treatment, and the at least one processing step $P_1$ is adding or removing a predictable amount of material on or from the substrate.

In the preferred method, suitable processing steps $P_1$ for forming the structure adding a predictable amount of material on the substrate are a plating step, or a CVD deposition step.

In the preferred method, suitable processing steps $P_1$ for forming the structure removing a predictable amount of material from the substrate are a step of timed dry-etching under known process conditions (or known etch rate), or selective dry-etching.

In the preferred method, the step of measuring the mass $M_1$ of the substrate can be performed immediately before performing the at least one processing step $P_1$, and/or the step of thermal treatment is performed immediately after performing the at least one processing step $P_1$, and/or the step of measuring the mass $M_2$ of the substrate is performed immediately after performing the step of thermal treatment.

The method further comprises the (fifth) step of calculating the mass difference between the mass of the substrate measured before and after the performed thermal treatment (or between the measured mass $M_1$ of the substrate and the measured mass $M_2$ of the substrate).

Finally, in the method, a (sixth) step of deducing the presence of embedded voids in the structure is performed by comparing the mass difference with a pre-determined value.

Figure 1:
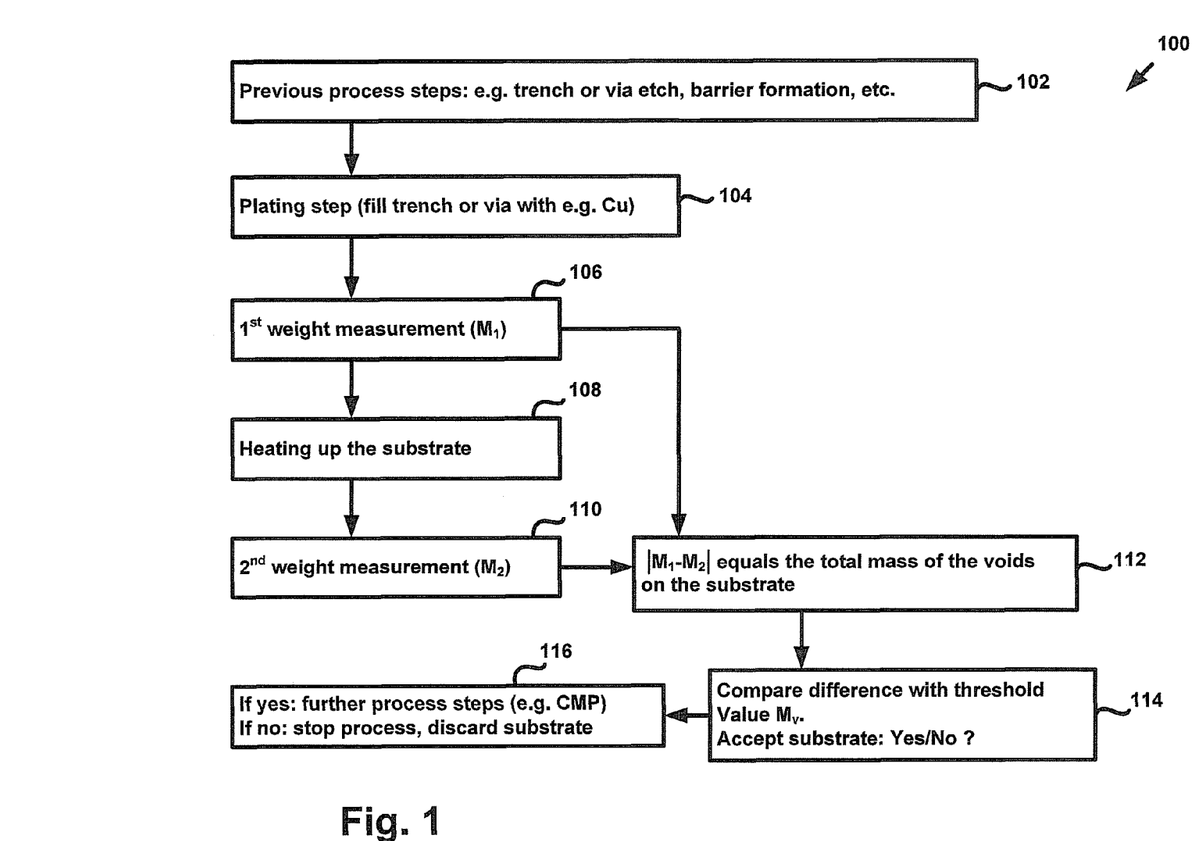
FIG. 1 represents a flow chart describing schematically the sequence of the process steps of the method according to an example.

FIG. 1 represents a flow chart describing schematically the sequence of the process steps of the method according to one preferred method.

More particularly, FIG. 1 illustrates a method 100 for detecting embedded voids present in a via or a trench in a semiconductor substrate, the method 100 starting at block 102 performing any process steps for forming the via or trench in the substrate, for example, etching the via or trench or forming a barrier layer.

At block 104, filling the via or trench with conductive material (e.g., Cu) by electroplating. Voids formed during plating in the via or trench contain (or are filled) with a plating liquid (as for example sulphuric acid from the plating bath).

Next, after the via or trench is filled with conductive material, at block 106 a step of measuring the mass $M_1$ of the substrate is performed. $M_1$ is a measure of the wafer weight, the wafer comprising vias or trenches filled with a conductive material that comprises voids containing the plating liquid.

Following the step of measuring the mass $M_1$, at block 108, the substrate is heated up by performing a thermal treatment step. The thermal treatment step is performed for driving out and evaporating the plating liquid out of the via or trench. The thermal treatment step is performed at a temperature and time sufficient for evaporating the plating liquid from the void. Preferably, the thermal treatment step will be performed at a temperature range between 120° C. up to 430° C., more preferably, for at least 20 minutes at 430° C.

At block 110, after the step of heating the substrate, a step of measuring the mass $M_2$ of the substrate is performed. As during the thermal treatment step, the plating liquid from the (embedded) voids has been driven out and evaporated, a substrate (or wafer) with (embedded) voids (in a via or a trench in the substrate) that is heated weighs less compared to the weight of the substrate before performing the thermal treatment step.

At block 112, the mass difference $|M_1-M_2|$ between the mass of the substrate measured before and after the performed thermal treatment (or between the measured mass $M_1$ of the substrate and the measured mass $M_2$ of the substrate) is calculated. The mass difference (or weight loss for a substrate (or wafer) with embedded voids in a via or a trench in the substrate) corresponds to the total volume of voids present on the wafer. The total volume of voids can be converted in equivalent number of voids of a certain volume on the wafer.

Figure 2:
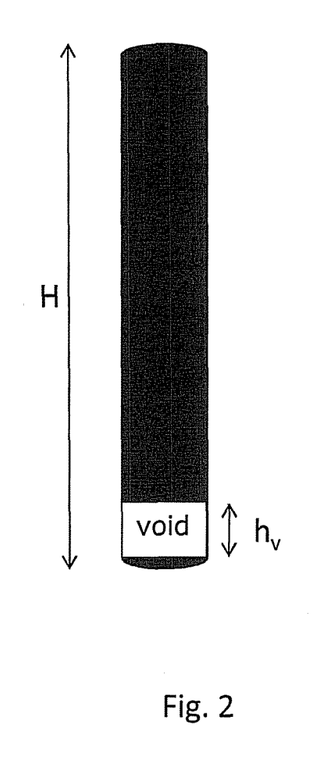
FIG. 2 represents the mass difference of a substrate (or wafer) with voids (d22/d23/d24) within the via or trench being higher than of a substrate (or wafer) without voids (d17/d18/d19).

The mass difference of a substrate (or wafer) with voids within the via or trench is higher than of a substrate (or wafer) without voids, as illustrated by FIG. 2. The mass difference $|M_1-M_2|$ equals the total mass of the (embedded) voids in the via or trench in the substrate. Furthermore, it is assumed that the total mass of the (embedded) voids in the via or trench is proportional to the volume of the voids.

A step of comparing the mass difference with a pre-determined (threshold) value $M_v$ is then performed at block 114. A maximum acceptable number of embedded voids $M_v$ present in a via or trench formed in or on a substrate (being thus an acceptable substrate) will be apparent to those skilled in the art.

If $|M_1-M_2|$ is lower than $M_v$, it is deduced that the substrate is acceptable, and further processing steps for forming (or finalizing, or fabricating) integrated circuits are performed at block 116. If, on the other hand, $|M_1-M_2|$ is higher than $M_v$, it is deduced that the substrate is not acceptable at block 116. The substrate will then be discarded and will not further be processed for forming (or fabricating) integrated circuits.

The method 100 is independent of processing steps adding or removing a non-predictable amount of material on or from the substrate, such as a chemical-mechanical processing (or chemical-mechanical polishing, or CMP) step which are performed after the steps of measuring the voids. Furthermore, the method 100 is also independent of processing steps adding or removing a predictable amount of material on or from the substrate performed in between the two measurements (M1 and M2), such as a plating step.

Figure 3:
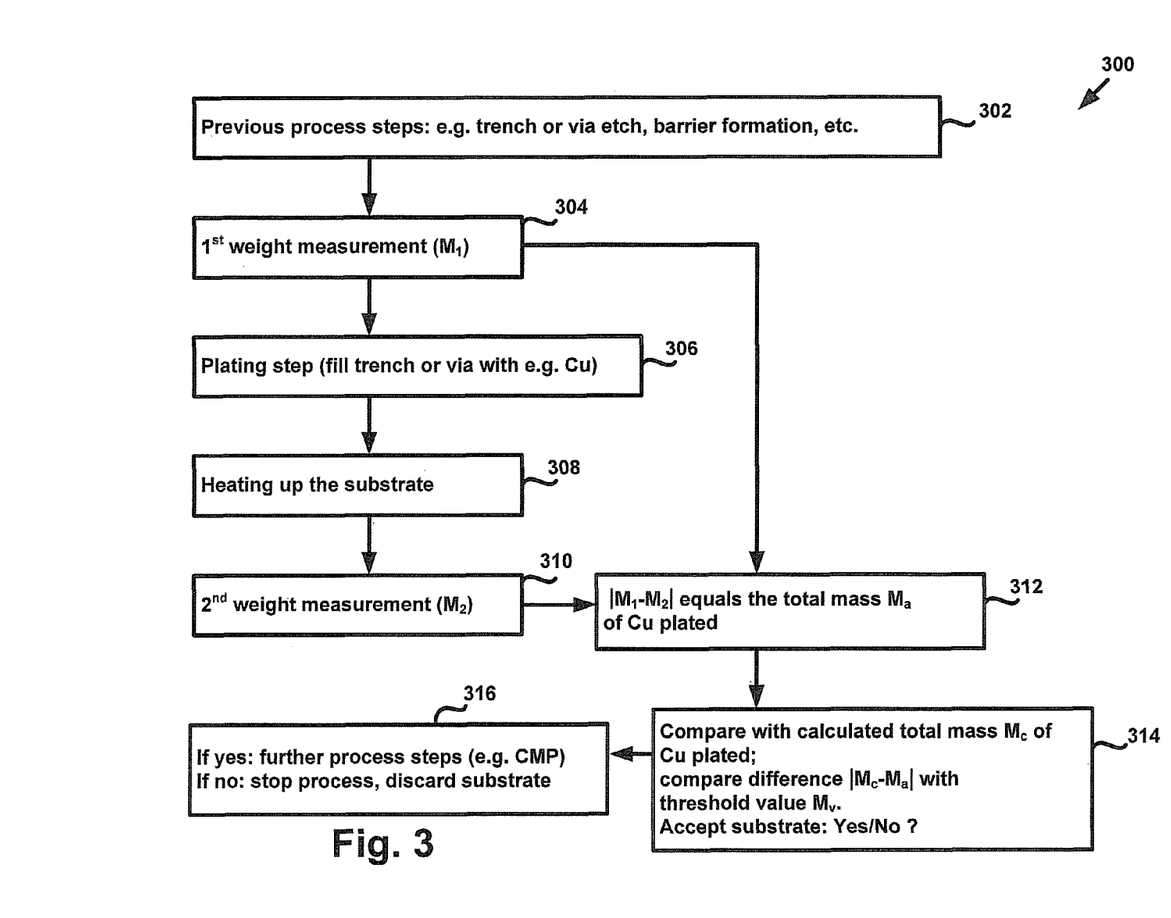
FIG. 3 represents a flow chart describing schematically the sequence of the process steps of the method according to another example.

FIG. 3 is a flow chart describing schematically the sequence of the process steps of a method 300 according to another preferred method of the invention.

More particularly, FIG. 3 illustrates a method 300 for detecting voids present in a via or a trench in a semiconductor substrate, the method 300 starting at block 302 with performing a process step for forming the via or trench in the substrate, for example, etching the via or trench, or forming a barrier layer.

These steps are then followed by, at block 304, a step of measuring the mass $M_1$ of the substrate, after which the via or trench is filled with conductive material (e.g., Cu) by a step of electroplating at block 306.

At block 308, after the via or trench is filled with conductive material, a step of thermal treatment is performed and the substrate is heated up.

At block 310, the thermal treatment is followed by a step of measuring the mass $M_2$ of the substrate.

At block 312, following the step of measuring the mass $M_2$, the mass difference $|M_1-M_2|$ between the mass of the substrate measured before and after the performed thermal treatment (or between the measured mass $M_1$ of the substrate and the measured mass $M_2$ of the substrate) is calculated. The mass difference $|M_1-M_2|$ equals the actual total mass $M_a$ of the conductive material (e.g., Cu) actually plated. As the step of filling the via or trench is a processing step adding a predictable amount of material on the substrate, the total mass $M_c$ of Cu theoretically plated can also be calculated.

At block 314, a step of comparing the mass difference $|M_c-M_a|$ with a pre-determined (threshold) value $M_v$ is then performed. A maximum acceptable number of embedded voids $M_v$ present in a via or trench formed in or on a substrate (being thus an acceptable substrate) will be apparent to those skilled in the art.

At block 316, if $|M_c-M_a|$ is lower than $M_v$, it is deduced that the substrate is acceptable, and further processing steps for forming (or finalizing, or fabricating) integrated circuits are performed. If, on the other hand at block 316, $|M_c-M_a|$ is higher than $M_v$, it is deduced that the substrate is not acceptable. The substrate will then be discarded and will not further be processed for forming (or fabricating) integrated circuits.

The method as represented in FIG. 3 is independent of processing steps adding or removing a non-predictable amount of material on or from the substrate, such as a chemical-mechanical processing (or chemical-mechanical polishing, or CMP) step which are performed after the steps of measuring the voids.

EXAMPLES

Figure 4:
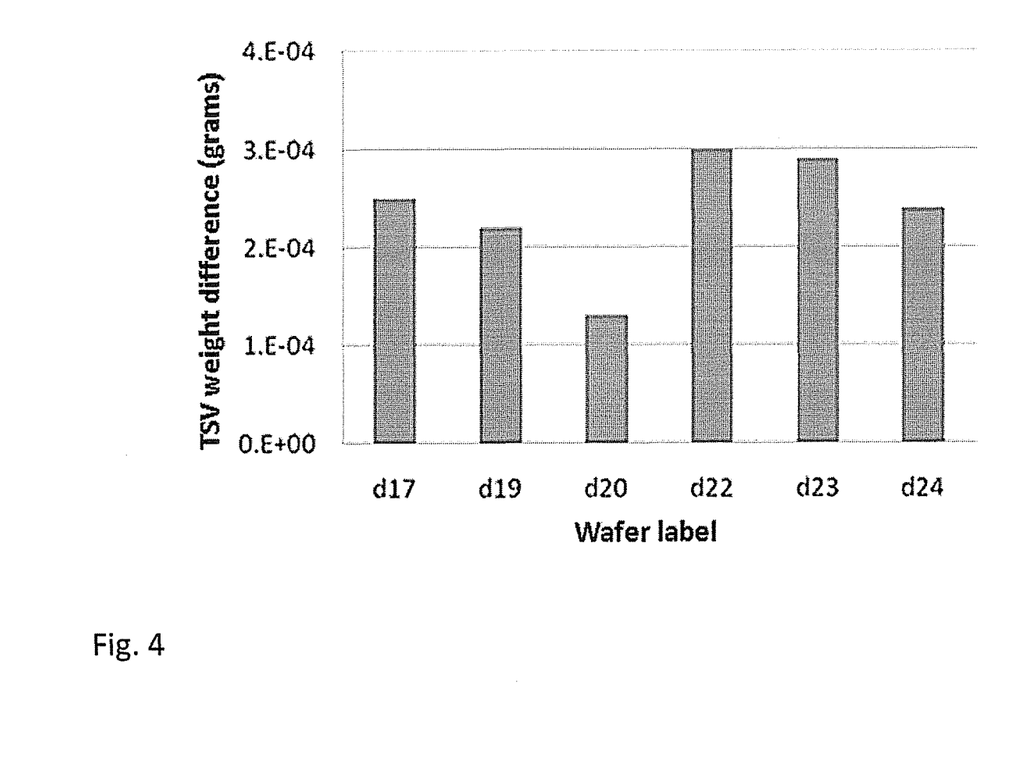
FIG. 4 represents a chart depicting the sensitivity of the mass metrology used in the present invention. More particularly.

The measurements shown in FIG. 4 were performed on Si wafers with a diameter of 300 mm. TSV's (or recessed regions, or patterned structures) were formed with a width× height ratio of 5×50 μm (1:10 aspect ratio). First a barrier layer comprising Ta/TaN and a copper (Cu) seed layer were deposited on (or in) the patterned structures (or TSV's). Then the patterned structures (or TSV's) were filed with copper by plating. The plating solution comprises 0.95M $CuSO_4.5H_2O$, 33 ml/L M $H_2SO_4$ and 50 ppm Cl, for a volume bath of 40 L and a current density of 3 $mA/cm^2$. Additionally, the plating solution comprises additives such as accelerator (2 ml/L) and suppressor (5 ml/L). The plating process was run for 40 minutes. The samples were annealed at 430° C., for 20 min., in an Argon environment. The mass of the wafers before and after anneal was measured using a Metryx® mass metrology tool (or weight balance).

Referring to FIG. 4, d17,d19,d20 samples were wafers having TSV's comprising no voids or a small number of voids. The mass difference (before-after anneal) on the y axis is about or below 200 micrograms. d22,d23,d24 samples are wafers having TSV's comprising a higher number of voids. The mass difference (before-after anneal) on the y axis is above 200 micrograms. By converting the acceptable number of voids in a threshold value for the mass difference, the wafers (substrates) having a number of voids above a pre-defined specification can be discarded or marked as defective. Although simplified, this is an illustrative example for the method of the invention. Threshold value definition can be refined by increasing the number of the samples with/without voids measured in the initial calibration procedure and taking into account the error ranges of the measuring process.

The invention claimed is:

1. A method for detecting embedded voids present in a structure formed in or on a semiconductor substrate, the method comprising:
   performing at least one processing step $P_1$ for forming the structure, wherein the structure comprises at least one recess formed in the substrate, and wherein the at least one processing step $P_1$ is a step of filling the at least one recess with material by electroplating, electroless plating, Metal-organic Chemical Vapor Deposition, Chemical Vapor Deposition, or Physical Vapor Deposition;
   measuring a mass $M_1$ of the substrate;
   performing a thermal treatment;
   measuring the mass $M_2$ of the substrate;
   calculating a mass difference between the mass of the substrate measured before and after the thermal treatment; and
   deducing the presence of embedded voids in the structure by comparing the mass difference with a pre-determined value, wherein the embedded voids are completely surrounded by material of the structure.

2. A method according to claim 1, wherein measuring the mass $M_1$ of the substrate is performed immediately before performing the step of thermal treatment.

3. A method according to claim 1, wherein measuring the mass $M_2$ of the substrate is performed immediately after performing the step of thermal treatment.

4. A method according to claim 1, wherein performing the at least one processing step $P_1$ for forming the structure is performed after measuring the mass $M_1$ of the substrate and before performing the thermal treatment, and wherein the at least one processing step $P_1$ is adding or removing a predictable amount of material on or from the substrate.

5. A method according to claim 4, wherein measuring the mass $M_1$ of the substrate is performed immediately before performing the at least one processing step $P_1$.

6. A method according to claim 4, wherein thermal treatment is performed immediately after performing the at least one processing step $P_1$.

7. A method according to claim 4, wherein measuring the mass $M_2$ of the substrate is performed immediately after performing the step of thermal treatment.

8. A method according to claim 1, wherein the at least one recess is at least one of a via and a trench.

9. A method according to claim 1, wherein the at least one recess has an aspect ratio between 1:1 and 1:100.

10. A method according to claim 1, wherein the at least one recess is filled with conductive material by electroplating or electroless plating.

11. A method according to claim 10, wherein the conductive material is copper or tungsten.

12. A method according to claim 1, wherein performing a thermal treatment is performed for filling the at least one recess with conductive material.

13. A method according to claim 1, wherein the at least one recess is a Through Silicon Via.

14. A method according to claim 1, wherein the thermal treatment is performed at a temperature range between 120° C. and 430° C.

15. A method according to claim 1, wherein the thermal treatment is performed for at least 20 minutes at 430° C.

16. A method according to claim 1, wherein the substrate is selected from the group consisting of silicon, silicon carbide, germanium, glass, quartz, a group III-V semiconductor material, or any combinations or mixtures thereof.

* * * * *